(12) United States Patent
Song et al.

(10) Patent No.: US 9,039,476 B2
(45) Date of Patent: May 26, 2015

(54) METHOD OF MANUFACTURING FLEXIBLE DISPLAY DEVICE

(71) Applicant: Samsung Display Co., LTD., Yongin, Gyeonggi-do (KR)

(72) Inventors: Hyun-Jung Song, Yongin (KR); Dong-Un Jin, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/974,000

(22) Filed: Aug. 22, 2013

(65) Prior Publication Data

US 2014/0323006 A1    Oct. 30, 2014

(30) Foreign Application Priority Data

Apr. 30, 2013  (KR) .................. 10-2013-0048516

(51) Int. Cl.
  *B28B 7/14*   (2006.01)
  *B32B 27/00*  (2006.01)
  *H01L 51/52*  (2006.01)

(52) U.S. Cl.
  CPC .................................. *H01L 51/5237* (2013.01)

(58) Field of Classification Search
  CPC ..... H01L 51/52; H01L 51/56; H01L 51/5088; H01L 21/02494
  USPC .................. 445/25; 427/66, 532–535, 539
  See application file for complete search history.

(56) References Cited

U.S. PATENT DOCUMENTS

| 2008/0158498 | A1* | 7/2008 | Chang et al. .................. 349/158 |
| 2009/0227074 | A1* | 9/2009 | Hong et al. .................... 438/149 |
| 2010/0210055 | A1* | 8/2010 | Yoon et al. ...................... 438/30 |
| 2013/0020731 | A1  | 1/2013 | Kim et al. |
| 2013/0071650 | A1* | 3/2013 | Liu et al. ........................ 428/333 |

FOREIGN PATENT DOCUMENTS

| KR | 10-2007-0054438 A | 5/2007 |
| KR | 10-2008-0114052 A | 12/2008 |
| KR | 10-2013-0010146 A | 1/2013 |

OTHER PUBLICATIONS

Shin, Korean Patent Unexamined Application Publication 10-2007-0054438, May 2007, machine translation.*

* cited by examiner

*Primary Examiner* — Tracie Y Green
(74) *Attorney, Agent, or Firm* — Christie, Parker & Hale, LLP

(57) ABSTRACT

A method of manufacturing a flexible display device includes: forming a soft substrate on a carrier substrate; forming a thin film layer comprising a display region on the soft substrate; removing a thin film layer excess portion of the thin film layer beyond an edge of the soft substrate; and separating the soft substrate and the carrier substrate.

9 Claims, 4 Drawing Sheets

LASER

LASER

METHOD OF MANUFACTURING FLEXIBLE DISPLAY DEVICE

CROSS-REFERENCE TO RELATED APPLICATION

This application claims priority to and the benefit of Korean Patent Application No. 10-2013-0048516 filed on Apr. 30, 2013, in the Korean Intellectual Property Office, the disclosure of which is incorporated herein in its entirety by reference.

BACKGROUND

1. Field

Embodiments of the present invention relate to a method of manufacturing a flexible display device.

2. Description of the Related Art

Much research into display devices, such as organic light-emitting display devices, has been conducted owing to their thin profile and flexibility in terms of driving characteristics.

Recently, a flexible display device that forms a display unit on a flexible soft substrate has been in the spotlight.

Such a flexible display device is manufactured by coating a soft material, such as polyimide, on a hard carrier substrate, forming a soft substrate, forming a display unit on the soft substrate, and separating the carrier substrate and the soft substrate from each other.

However, when the carrier substrate and the soft substrate are separated from each other, incomplete separation frequently occurs partly because a part of thin film layers formed on the soft substrate spreads outside the soft substrate and directly sticks to the carrier substrate during a manufacturing process. The soft substrate is well separated from the carrier substrate if heat is appropriately applied to the soft substrate, whereas thin film layers directly sticking to the carrier substrate are not separated. Thus, in this case, if the carrier substrate is removed, because a surplus portion of the directly sticking thin film layers is not separated from the carrier substrate, problematically, an end portion of the flexible display device adjacent to the surplus portion is forcibly removed (or ripped) during a separation process.

As a result, a bad product is produced, and thus a solution to this is desired.

SUMMARY

Aspects of embodiments of the present invention are directed toward a method of manufacturing an improved flexible display device that allows a clean and stable separation between a carrier substrate and a soft substrate.

Aspects of embodiments of the present invention are directed toward a method of manufacturing an improved flexible display device that smoothly performs a separation operation of a carrier substrate.

According to an embodiment of the present invention, there is provided a method of manufacturing a flexible display device, the method including: forming a soft substrate on a carrier substrate; forming a thin film layer comprising a display region on the soft substrate; removing a thin film layer excess portion of the thin film layer beyond an edge of the soft substrate; and separating the soft substrate and the carrier substrate.

The removing may include irradiating a laser onto and burning the excess portion of thin film layer.

During the laser irradiating and burning, the thin film layer excess portion around the edge of the soft substrate may be removed by irradiating the laser onto the edge of the soft substrate.

During the laser irradiating and burning, the thin film layer excess portion may be entirely removed by irradiating the laser onto the thin film layer excess portion.

The laser may be a laser of a UV-Green wavelength band.

The laser may be irradiated onto the thin film layer excess portion through the carrier substrate.

The laser may be irradiated onto the thin film layer excess portion at the opposite side of the carrier substrate.

The soft substrate may include a polyimide material, and the carrier substrate may include a glass material.

According to another embodiment of the present invention, there is provided a system of manufacturing a flexible display device, the system including: means for forming a soft substrate on a carrier substrate; means for forming a thin film layer comprising a display region on the soft substrate; means for removing a thin film layer excess portion of the thin film layer beyond an edge of the soft substrate; and means for separating the soft substrate and the carrier substrate.

BRIEF DESCRIPTION OF THE DRAWINGS

The above and other features and aspects of the present invention will become more apparent by describing in more detail embodiments thereof with reference to the attached drawings in which.

DETAILED DESCRIPTION

Aspects of the present invention will now be described more fully with reference to the accompanying drawings, in which embodiments of the present invention are shown.

Figure 1:
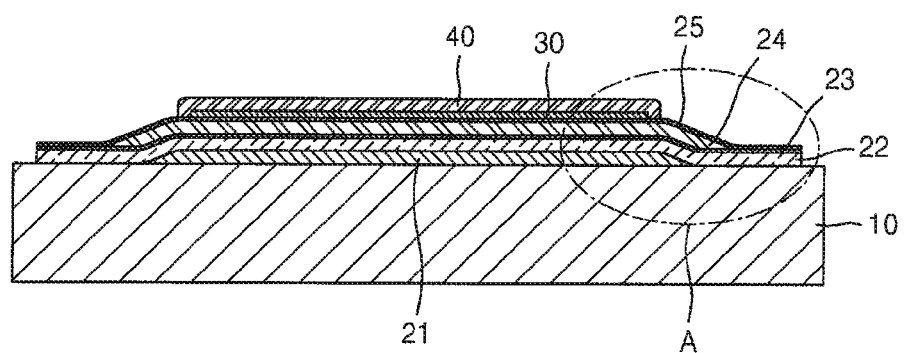
FIG. 1 is a cross-sectional view of a coupling state of a carrier substrate of a flexible display device manufactured by using a method according to an embodiment of the present invention.

FIG. 1 is a cross-sectional view of a coupling state of a carrier substrate 10 of a flexible display device manufactured by using a method according to an embodiment of the present invention.

The flexible display device of the present embodiment as shown includes a structure in which first and second soft substrates 21 and 24 (formed of a polyimide material), first and second barrier layers 22 and 25 (that are inorganic layers), a display unit (or display region) 30 (that forms an image), and a thin film sealing layer 40 (that seals the display unit 30) are stacked with each other. That is, instead of a given thick and hard glass substrate, a flexible structure that seals the display unit 30 with the first and second soft substrates 21 and 24 formed of a very thin polyimide material and the thin film sealing layer 40 is realized.

Therefore, compared to a given typical structure that surrounds upper and lower portions of the display unit 30 with the thick glass substrate, the flexible display device of the present embodiment has a dramatically increased flexibility and enables display when a screen is bent.

Reference numeral 23 denotes an amorphous silicon layer. In this regard, the soft substrates and barrier layers form a two-layer stack structure of the first soft substrate 21/the first barrier layer 22 and the second soft substrate 24/the second barrier layer 25. In another embodiment, a single layer stack structure may be used.

Because the first and second soft substrates 21 and 24 may not be easily handled due to their flexible characteristics, in one embodiment, the first and second soft substrates 21 and 24 are transferred by being formed on a hard carrier substrate 10 formed of the glass material during manufacturing and separated from the carrier substrate 10 after the sealing layer 40 is formed.

In one embodiment, the display unit 30 is a layer including a thin film transistor and an emissive layer (or emission layer), and forming an image. In this regard, the display unit 30 is shown.

In one embodiment, the sealing layer 40 is a layer having a damp proof property that reduces (or prevents) penetration of moisture from the outside. The sealing layer 40 is configured as, for example in one embodiment, a thin film layer on which a multilayer of SiO/SiN and transparent polyimide are stacked, and has a thickness in range of about 1 μm to about 10 μm as the thin film layer.

All thin film layers provided on the first soft substrate 21 that is a base layer contacting the carrier layer 10, may be formed within a region of the first soft substrate 21. That is, as described above, because the first soft substrate 21 is separated well (or separated easily) from the carrier substrate 10 when the first soft substrate 21 is appropriately heated, when the carrier substrate 10 is removed later, a clean and stable separation operation is possible. However, because other layers, for example, the first barrier layer 22, do not have the same characteristic as the first soft substrate 21, if other layers spread beyond the first soft substrate 21 and stick to the carrier substrate 10, when the carrier substrate 10 is separated, an end portion may be removed with difficulty.

Figure 2:
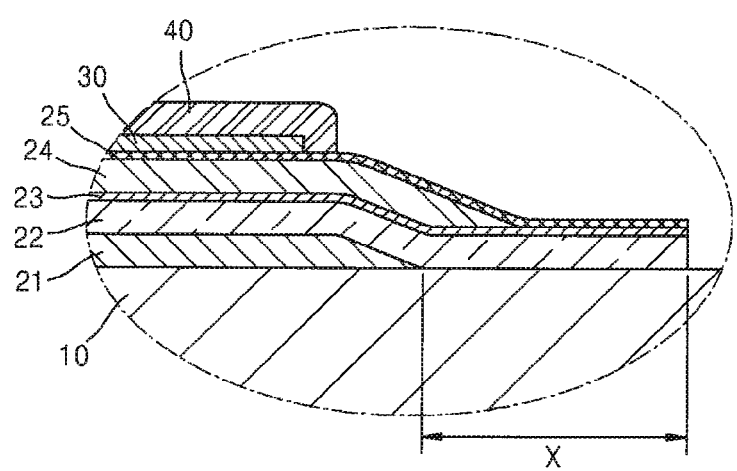
FIG. 2 is an enlarged view of a part A of the flexible display device shown in FIG. 1.

However, when a filming operation is performed, as shown in a region A of FIG. 1, a phenomenon frequently occurs in that the thin film layers spread beyond the first soft substrate 21 that is the base layer and stick to the carrier substrate 10. A region X of FIG. 2, which is an enlargement of the region A, is a thin film layer surplus portion (or excess portion), in which the thin film layers provided on the first soft substrate 21 spread beyond the region of the first soft substrate 21 and stick to the carrier substrate 10. In this case, in one embodiment, when the carrier substrate 10 is separated later, the portion in the region X is not properly separated. In this state, if the carrier substrate 10 is removed, an end portion of the flexible display device may be dragged to (or pulled by) the thin film layers sticking to the region X and removed from the flexible display device.

Figure 3:
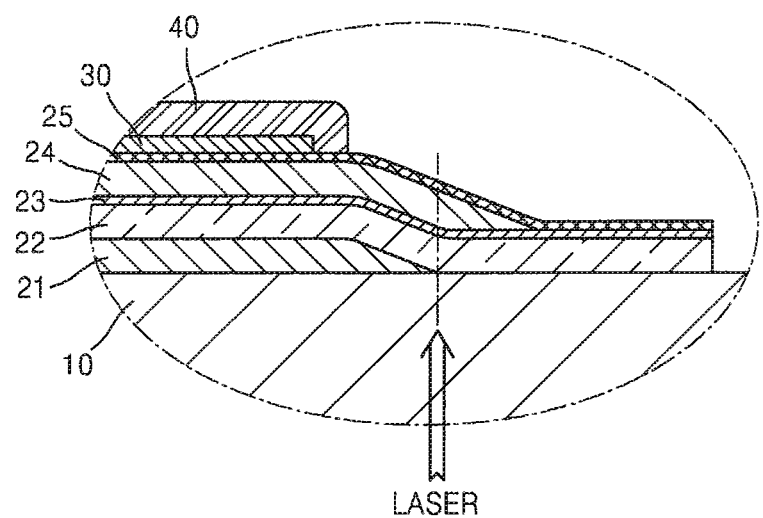
FIGS. 3 through 5 are views illustrating a process of separating the carrier substrate of FIG. 1 in a manufacturing method according to an embodiment of the present invention.
Figure 4:
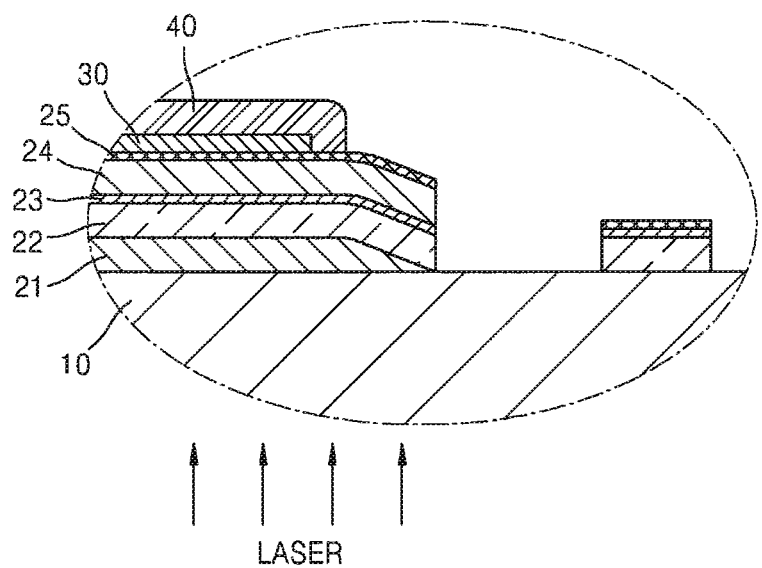
Figure 5:
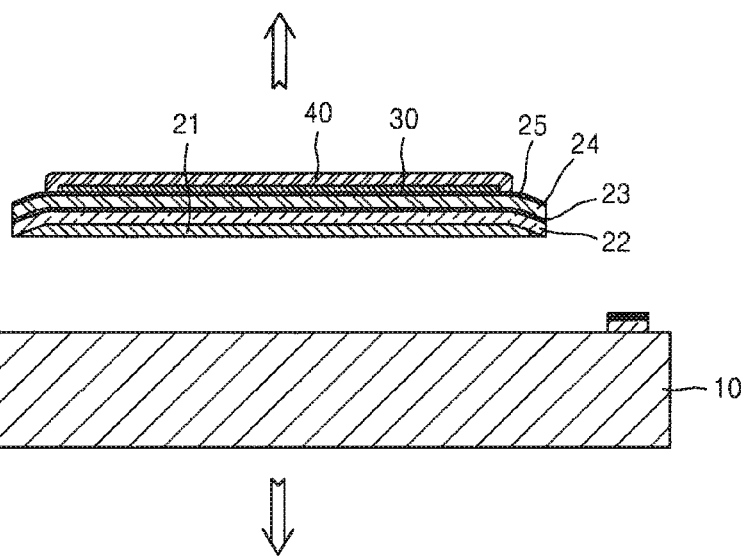

Therefore, to solve this problem, a manufacturing method of the present embodiment performs a laser cutting operation, as shown in FIG. 3, before separating the carrier substrate 10. That is, in one embodiment, a laser is irradiated (or emitted) onto a boundary edge of the first soft substrate 21 that is the base layer through the carrier substrate 10. In this regard, in one embodiment, the laser should pass through the carrier substrate 10 and thus a laser having a good transmittivity UV-Green wavelength band is used. Then, the boundary edge (onto which the laser is irradiated) is burnt (e.g., burnt away) and clearly removed as shown in FIG. 4. Thus, a connection part dragging (or pulling) the end portion of the flexible display device is cut, and thus the problem of removal of the end portion is reduced (or prevented). In this state, if heat is applied to the carrier substrate 10 by irradiating a UV laser onto a front surface of the carrier substrate 10, the carrier substrate 10 and the first soft substrate 21 are separated from each other by a difference of a thermal expansion coefficient between two layers at a boundary surface of the carrier substrate 10 formed of the glass material and the first soft substrate 21 formed of the polyimide material. Thus, if the carrier substrate 10 is clearly separated, as shown in FIG. 5, the first soft substrate 21 remains as a base substrate without the problem of removal of the end portion.

The above-described process of manufacturing the flexible display device of the present embodiment will now be summarized.

As shown in FIG. 1, and in one embodiment, the first soft substrate 21 formed of the polyimide material that is the base layer is formed on the carrier substrate 10 formed of the glass material, and on the first soft substrate 21, the first barrier layer 22, the amorphous silicon layer 23, the second soft substrate 24, the second barrier layer 25, the display unit 30, and the thin film sealing layer 40 are sequentially formed. During this process, as shown by the region X of FIG. 2, a part at which the thin film layers provided on the first soft substrate 21 spread beyond the first soft substrate 21 and directly stick to the carrier substrate 10 results.

Thereafter, as shown in FIG. 3, in one embodiment a laser is irradiated onto the edge boundary of the first soft substrate 21 through the carrier substrate 10. Thus, the edge boundary onto which the laser is irradiated is burnt (e.g., burnt away) and clearly removed, as shown in FIG. 4.

In this state, when heat is applied to the carrier substrate 10 by irradiating (or emitting) a UV laser onto the front surface of the carrier substrate 10, the carrier substrate 10 and the first soft substrate 21 are separated from each other by a difference of a thermal expansion coefficient between two layers in a boundary surface of the carrier substrate 10 formed of the glass material and the first soft substrate 21 formed of the polyimide material.

As a result, in one embodiment, when the carrier substrate 10 is clearly separated as shown in FIG. 5, the first soft substrate 21 remains as a base substrate without the problem of the removal of the end portion.

Therefore, the method of cutting the boundary portion of the first soft substrate 21 that is the base layer by using a laser, before separating the carrier substrate 10, may reduce the possibility of occurrence of (or prevent) the problem of the end portion of the flexible display device being accidently removed, thereby dramatically reducing a product failure occurrence rate.

Figure 6:
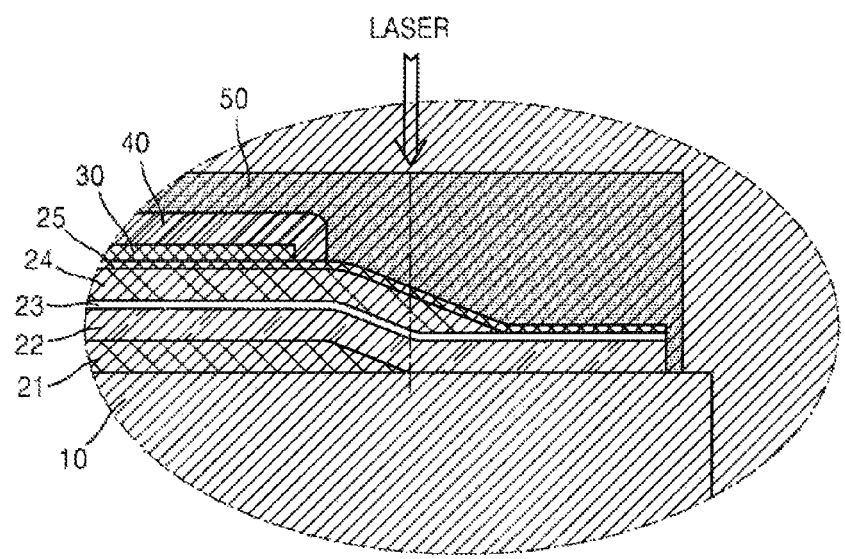
FIGS. 6 and 7 are views illustrating a modified method of the process of separating the carrier substrate shown in FIGS. 3 through 5.

Although the above-described embodiment exemplifies a case of irradiating laser through the carrier substrate 10 during the laser cutting, as shown in FIG. 3, as shown in FIG. 6, in one embodiment a protection film 50 is attached onto the thin film sealing layer 40, and laser may be irradiated through the protection film 50 on the opposite side of the carrier substrate 10. That is, a laser irradiation direction may be suitably or freely changed.

Figure 7:
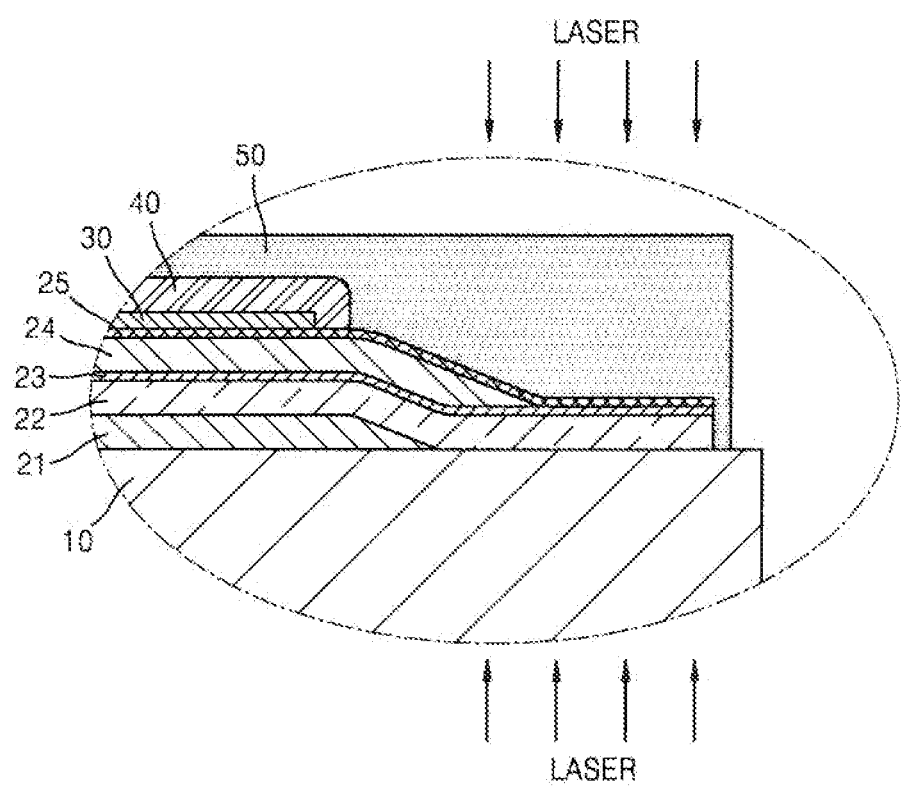

Further, although the above-described embodiment exemplifies the method of irradiating laser onto only the edge boundary of the first soft substrate 21 during the laser cutting, as shown in FIG. 7, a part beyond the first soft substrate 21 may be completely removed by irradiating a laser onto the overall region outside the edge boundary of the first soft substrate 21. At this time, the laser irradiation direction may be a direction in which a laser passes through the carrier substrate 10 and/or an opposite direction to that direction.

That is, the laser irradiation direction and/or the part to be irradiated may be modified in various suitable ways.

Therefore, according to the above-described manufacturing method, a carrier substrate and a soft substrate may be clearly and stably separated from each other, thereby increasing productivity and reducing a risk of product damage.

While aspects of the present invention have been particularly shown and described with reference to embodiments thereof, it will be understood by those of ordinary skill in the art that various changes in form and details may be made therein without departing from the spirit and scope of the present invention as defined by the following claims, and equivalents thereof.

What is claimed is:

1. A method of manufacturing a flexible display device, the method comprising:
    forming a first soft substrate on a carrier substrate;
    forming a barrier layer on the first soft substrate;
    forming a second soft substrate on the barrier layer;
    forming a thin film layer comprising a display region on the second soft substrate;
    removing excess portions of the thin film layer, the barrier layer, and the second soft substrate beyond an edge of the first soft substrate when viewed in a plan view; and
    separating the first soft substrate and the carrier substrate.

2. The method of claim 1, wherein the removing comprises irradiating a laser onto and burning the excess portions.

3. The method of claim 2, wherein, during the laser irradiating and burning, the excess portions around the edge of the first soft substrate is removed by irradiating the laser onto the edge of the soft substrate.

4. The method of claim 2, wherein, during the laser irradiating and burning, the excess portions is entirely removed by irradiating the laser onto the excess portions.

5. The method of claim 2, wherein the laser has a UV-Green wavelength band.

6. The method of claim 2, wherein the laser is irradiated onto the excess portions through the carrier substrate.

7. The method of claim 2, wherein the laser is irradiated onto the excess portions at an opposite side of the carrier substrate.

8. The method of claim 1, wherein the soft substrate comprises a polyimide material, and the carrier substrate comprises a glass material.

9. A system of manufacturing a flexible display device, the system comprising:
    means for forming a first soft substrate on a carrier substrate;
    means for forming a barrier layer on the first soft substrate;
    means for forming a second soft substrate on the barrier layer;
    means for forming a thin film layer comprising a display region on the second soft substrate;
    means for removing excess portions of the thin film layer the barrier layer, and the second soft substrate beyond an edge of the first soft substrate when viewed in a plan view; and
    means for separating the soft substrate and the carrier substrate.

* * * * *